US012784675B2

(12) United States Patent
Yang et al.

(10) Patent No.: US 12,784,675 B2
(45) Date of Patent: Nov. 3, 2026

(54) DRIVING SUBSTRATE AND DISPLAY DEVICE

(71) Applicant: TCL CHINA STAR OPTOELECTRONICS TECHNOLOGY CO., LTD., Shenzhen (CN)

(72) Inventors: Rongjuan Yang, Shenzhen (CN); Jiangbo Yao, Shenzhen (CN); Zhifu Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 19/238,542

(22) Filed: Jun. 16, 2025

(65) Prior Publication Data

US 2026/0188203 A1 Jul. 2, 2026

(30) Foreign Application Priority Data

Dec. 31, 2024 (CN) ........................ 202411999557.0

(51) Int. Cl.
*G09G 3/3225* (2016.01)
*H10K 59/121* (2023.01)

(52) U.S. Cl.
CPC ....... *G09G 3/3225* (2013.01); *H10K 59/1213* (2023.02); *G09G 2300/0426* (2013.01); *G09G 2300/0819* (2013.01); *G09G 2300/0842* (2013.01)

(58) Field of Classification Search
CPC ......... G09G 3/3225; G09G 2300/0426; G09G 2300/0819; G09G 2300/0842; H10K 59/1213
See application file for complete search history.

(56) References Cited

U.S. PATENT DOCUMENTS

| | | | | |
|---|---|---|---|---|
| 2009/0315815 A1* | 12/2009 | Woo | G09G 3/3233 | 345/82 |
| 2013/0057532 A1* | 3/2013 | Lee | G09G 3/3225 | 345/76 |
| 2019/0229131 A1* | 7/2019 | Chung | H10K 59/1213 | |
| 2022/0398977 A1* | 12/2022 | Xue | G09G 3/3291 | |
| 2024/0196680 A1* | 6/2024 | Chai | H10K 59/123 | |
| 2024/0215312 A1* | 6/2024 | Liu | H10K 59/1216 | |
| 2025/0157401 A1* | 5/2025 | Long | G09G 3/3233 | |

* cited by examiner

*Primary Examiner* — Premal R Patel
(74) *Attorney, Agent, or Firm* — PV IP PC; Christopher S. Ruprecht; Wei Te Chung

(57) ABSTRACT

Embodiments of this application provide a driving substrate, and a display device. The driving substrate includes a plurality of pixel regions, and a plurality of pixel driving circuits corresponding to the plurality of pixel regions; each of the plurality of pixel driving circuits includes a switching transistor and a driving transistor, which are connected to each other; the switching transistor includes a switching active portion; the driving transistor includes a driving active portion; a material of the switching active portion differs from a material of the driving active portion; the switching active portion and the driving active portion are arranged in different layers, and the switching active portion partially overlaps with the driving active portion in a thickness direction of the driving substrate.

20 Claims, 12 Drawing Sheets

DRIVING SUBSTRATE AND DISPLAY DEVICE

CROSS-REFERENCE TO RELATED APPLICATION

This application claims priority to and the benefit of Chinese Patent Application No. 202411999557.0 filed on Dec. 31, 2024, the disclosure of which is incorporated herein by reference in its entirety.

TECHNICAL FIELD

The present application relates to display technologies, and in particular, to a driving substrate, and a display device.

BACKGROUND

Organic light-emitting diode (OLED) display panels have an advantage of being able to be made into flexible devices, and can use in various applications such as wearable devices like smart bracelets, smart watches, and virtual reality (VR) devices, mobile phones, e-books, electronic newspapers, televisions, and personal portable computers, etc.

Like VR devices, more components, such as thin-film transistors, need to be arranged to improve device performance or resolution. However, due to an inherently small volume of a display panel and limitations in photolithography process conditions, increasing the number of components in the display panel is challenging.

SUMMARY

According to one or more embodiments of the present application, a driving substrate is provided. The driving substrate includes a plurality of pixel regions, and a plurality of pixel driving circuits corresponding to the plurality of pixel regions; each of the plurality of pixel driving circuits includes a switching transistor and a driving transistor, which are connected to each other;

the switching transistor includes a switching active portion; the driving transistor includes a driving active portion; a material of the switching active portion differs from a material of the driving active portion; the switching active portion and the driving active portion are arranged in different layers, and the switching active portion partially overlaps with the driving active portion in a thickness direction of the driving substrate.

According to one or more embodiments of the present application, a display device is further provided. The display device includes the driving substrate as mentioned above.

BRIEF DESCRIPTION OF THE DRAWINGS

In order to more clearly illustrate the technical solutions in embodiments of the present application, the accompanying drawings to be used in the description of the embodiments will be briefly introduced below. It will be apparent that the drawings in the following description are merely illustrative of some embodiments of the present application, and that other drawings may be made by the skilled person in the art without involving any inventive effort.

In order to fully understand the present application and its beneficial effects, the following description will be made in conjunction with the accompanying drawings, wherein identical reference numerals indicate identical parts in the subsequent description.

DESCRIPTION OF REFERENCE NUMERALS IN THE DRAWINGS

10. Substrate; 101. Pixel region; 1101. Pixel driving circuit; 11. First connection point; 12. Second connection point; 13. Third connection point; 14. Fourth connection point; 15. Fifth connection point;

21. First semiconductor layer; 211. Driving active portion; 212. First reset active portion; 22. Second semiconductor layer; 221. Switching active portion; 222. Second reset active portion; 223. First transfer line;

31. First gate layer; 311. Driving gate; 312. First control signal line; 32. Second gate layer; 321. Second control signal line; 322. Third control signal line;

41. First metal layer; 411. Power signal line; 412. First reset signal line; 413. Capacitor plate; 414. Fourth transfer line; 42. Second metal layer; 421. Data line;

422. Second transfer line; 423. Signal transmitting portion; 4231. First end; 4232. Second end; 43. Third metal layer; 431. Second reset signal line; 432. Third transfer line;

51. Light-shielding layer; 511. First light-shielding portion; 512. Second light-shielding portion; 52. Anode layer; 521. Anode;

61. Buffer layer; 62. First gate insulating layer; 63. First insulating layer; 64. Second insulating layer; 65. Third insulating layer; 66. Second gate insulating layer; 67. Fourth insulating layer; 68. First flat layer; 69. Second flat layer;

70. pixel defining layer.

DETAILED DESCRIPTION

The technical solution in the embodiments of the present application will be clearly and completely described with reference to the accompanying drawings. It will be apparent that the described embodiments are only part of the embodiments of the present application, and not all of them. Based on the embodiments in the present application, all other embodiments obtained by the skilled person in the art without involving any inventive effort are within the scope of the present application.

Figure 1:
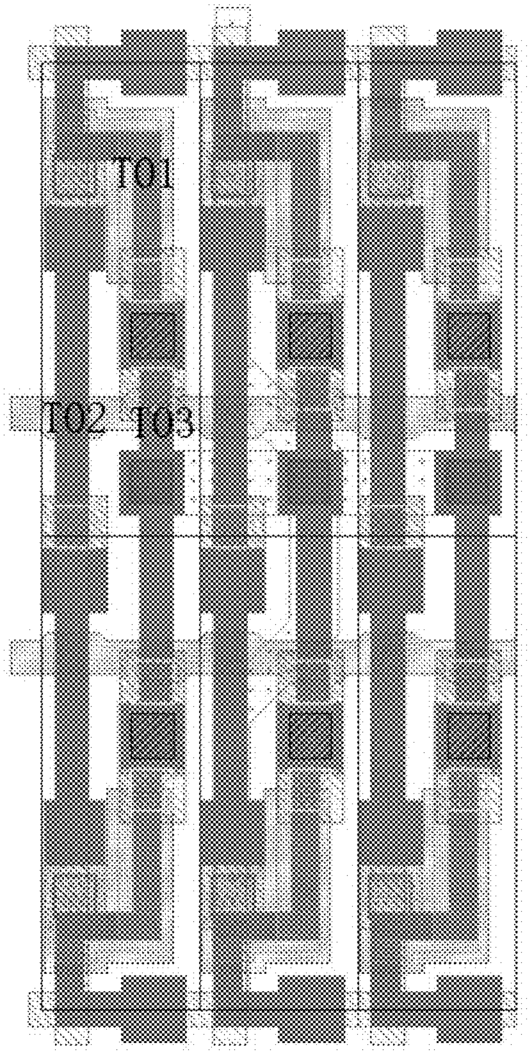
(PRIOR ART) FIG.1
FIG. 1 is a schematic structural diagram of a pixel driving circuit of a display panel in an embodiment.

Referring to FIG. 1, a schematic structural diagram of a pixel driving circuit of a display panel is provided. The pixel driving circuit of the display panel includes a first transistor T01, a second transistor T02, a third transistor T03, and a fourth transistor T04. An active layer of the first transistor T01, an active layer of the second transistor T02, an active layer of the third transistor T03, and an active layer of the fourth transistor T04 are located on a same layer, resulting in insufficient wiring space, which in turn limits the number of transistors in the pixel driving circuit, and is not conducive to a performance improvement and a resolution improvement of the display panel.

Figure 2:
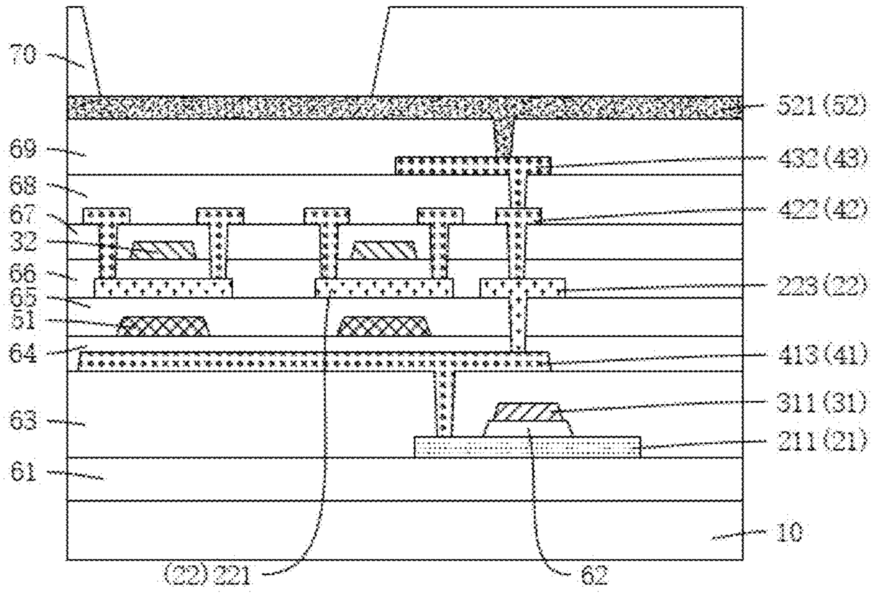
FIG. 2 is a schematic structural diagram of a driving substrate according to one or more embodiments of the present application.
Figure 3:
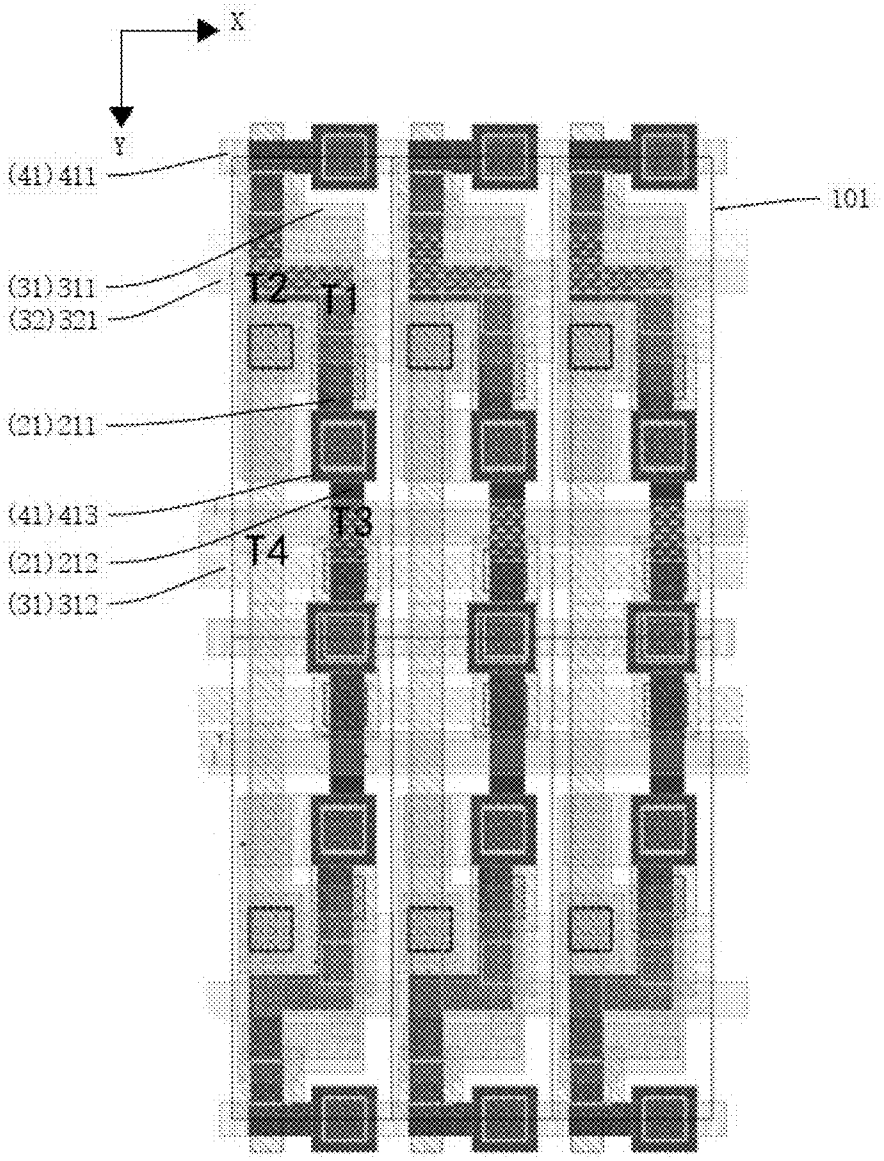
FIG. 3 is a schematic structural diagram of a pixel driving circuit of a driving substrate according to one or more embodiments of the present application.
Figure 4:
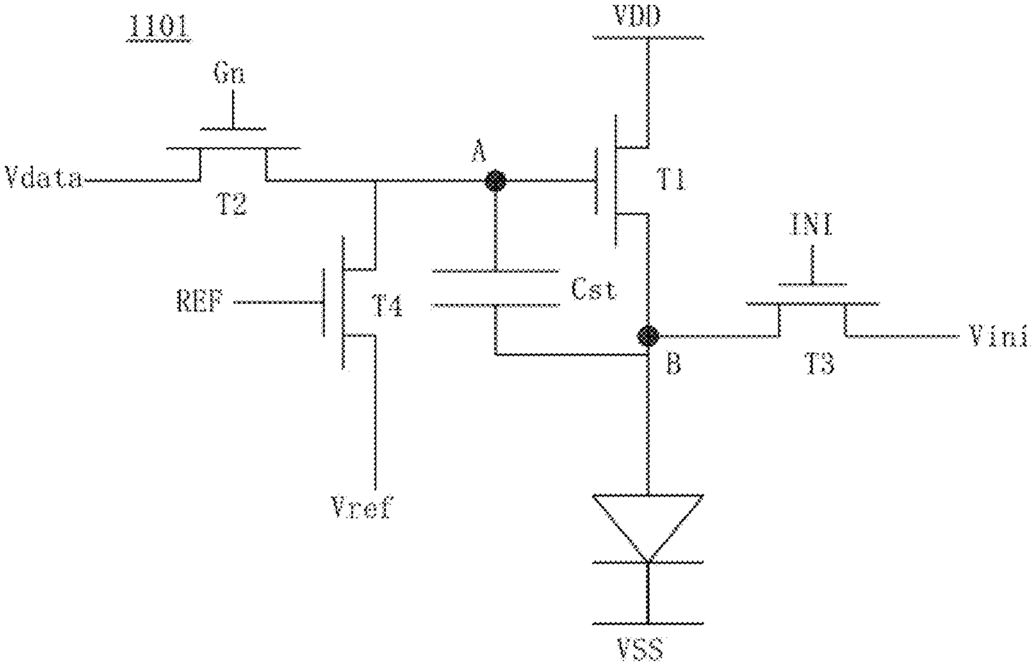
FIG. 4 is a circuit diagram of a pixel driving circuit of a driving substrate according to one or more embodiments of the present application.
Figure 5:
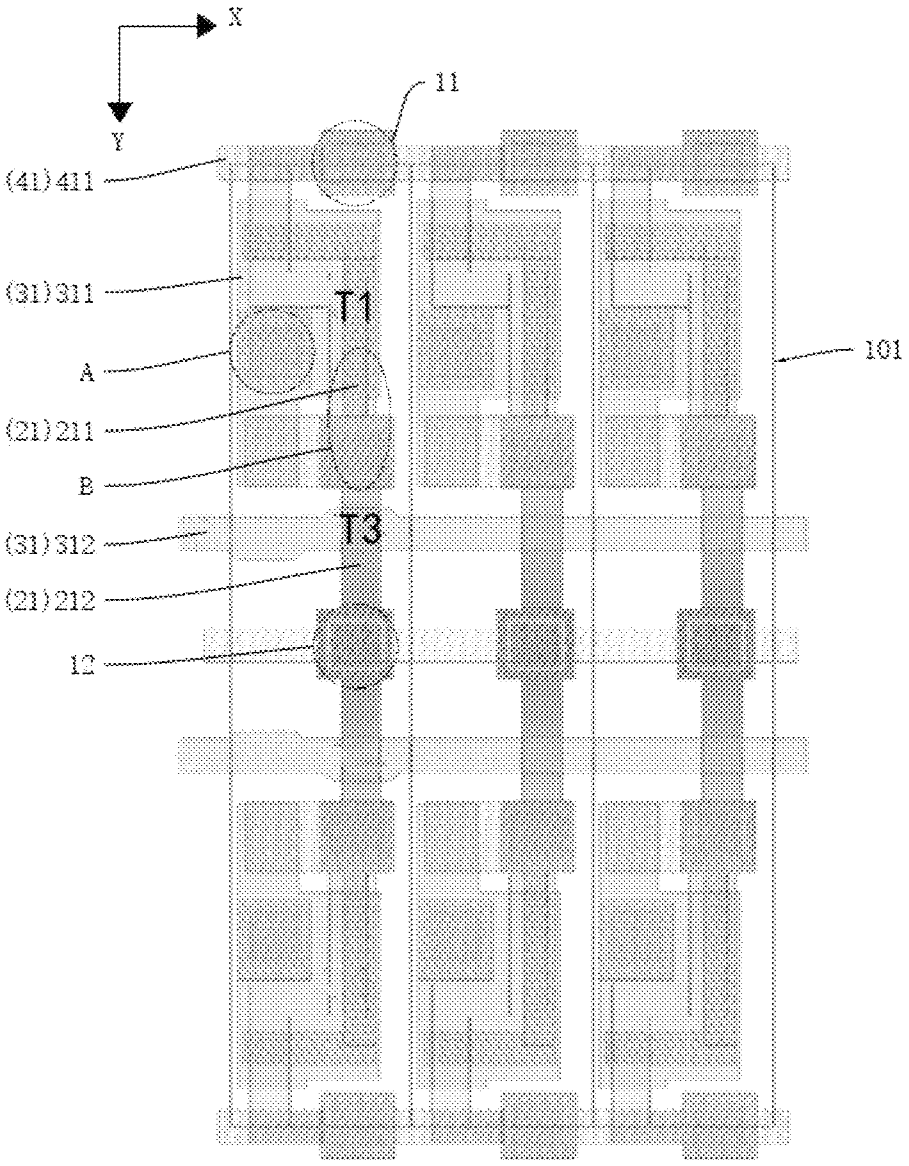
FIG. 5 is a schematic structural diagram of a first structure of a pixel driving circuit of a driving substrate according to one or more embodiments of the present application.
Figure 6:
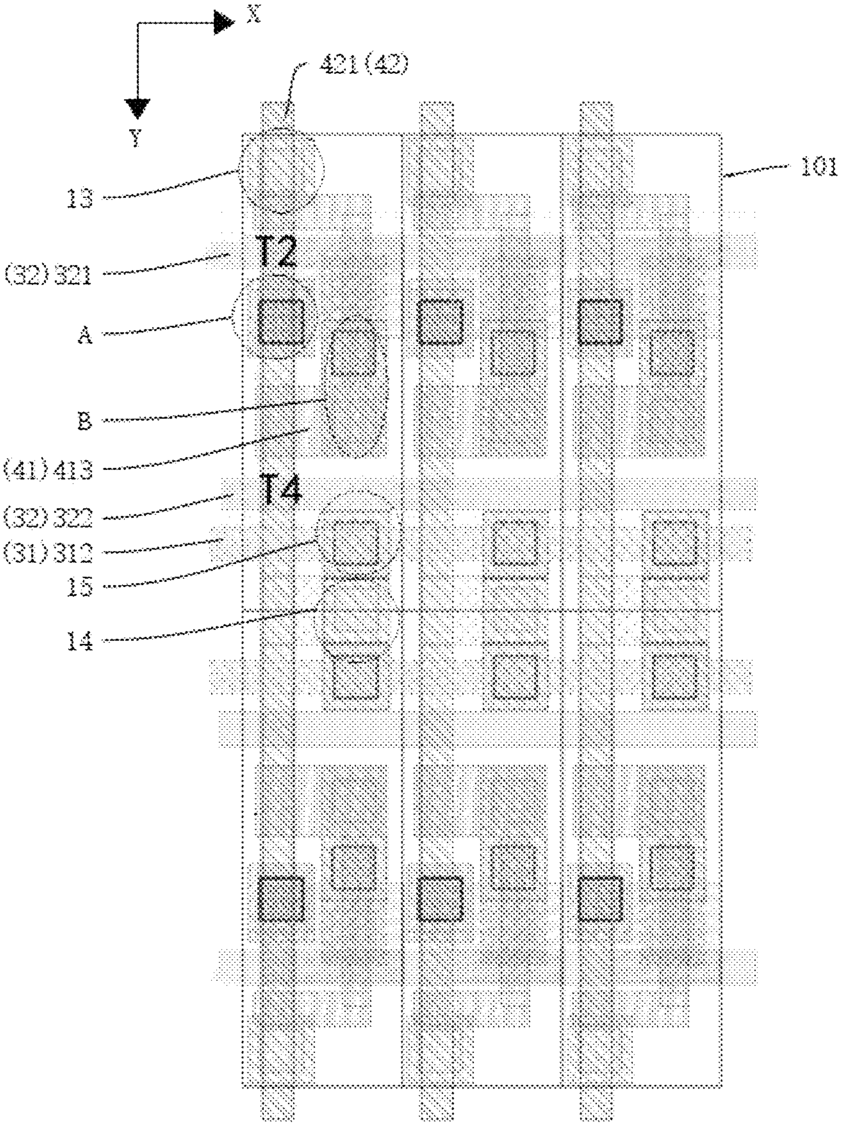
FIG. 6 is a schematic structural diagram of a second structure of a pixel driving circuit of a driving substrate according to one or more embodiments of the present application.
Figure 7:
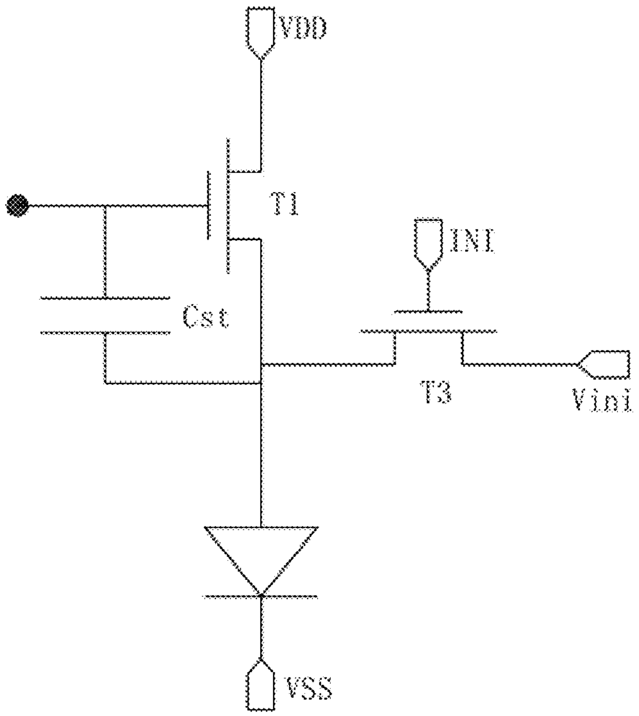
FIG. 7 is a circuit diagram of the pixel driving circuit shown in FIG. 5.
Figure 8:
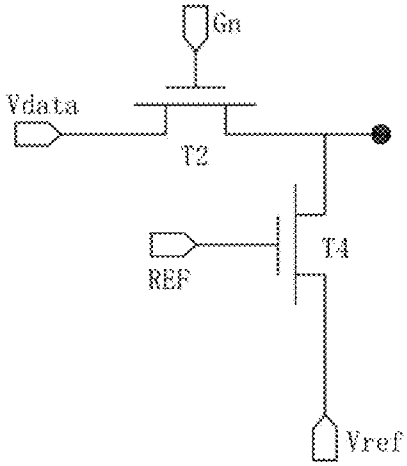
FIG. 8 is a circuit diagram of the pixel driving circuit shown in FIG. 6.

Referring to FIGS. 2 to 4, embodiments of the present application provide a driving substrate, which includes a plurality of pixel regions 101, and a plurality of pixel driving circuits 1101 that are arranged corresponding to the plurality of pixel regions 101. Each of the pixel driving circuits 1101 includes a switching transistor T2 and a driving transistor T1, which are connected with each other.

The switching transistor T2 includes a switching active portion 221. The driving transistor T1 includes a driving active portion 211. A material of the switching active portion 221 differs from a material of the driving active portion 211. The switching active portion 221 and the driving active portion 211 are arranged in different layers, and they partially overlap in a thickness direction of the driving substrate.

In implementation processes, the embodiments of the present application can increase a space in a film layer to arrange the greater number of components and traces by arranging the driving active portion 211 of the driving transistor T1 and the switching active portion 221 of the switching transistor T2 in different layers. Additionally, the driving active portion 211 and the switching active portion 221 partially overlap along the thickness direction of the driving substrate, which can further increase a wiring space to increase the number of thin-film transistors, and improve a performance and resolution of the driving substrate.

Specifically, referring to FIGS. 2 to 4, the driving substrate includes a display region, and a non-display region adjacent to the display region. The display region of the driving substrate can include the plurality of pixel regions 101, which can be arranged in an array along a first direction X and a second direction Y.

In some embodiments, the first direction X and the second direction Y are perpendicular to each other.

In some embodiments, the driving substrate further includes the plurality of driving circuits 1101 that correspond to the plurality of pixel regions 101. For instance, the plurality of pixel driving circuits 1101 are disposed within the plurality of pixel regions 101 in a one-to-one correspondence.

In some embodiments, the driving substrate further includes a substrate 10, and a component layer disposed on the substrate 10. Both the components and the traces of the pixel driving circuit 1101 can be arranged in the component layer. The pixel driving circuit 1101 may include a plurality of thin-film transistors and traces disposed within the component layer.

Referring to FIGS. 2 to 17, the component layer includes a buffer layer 61 disposed on the substrate 10, a first semiconductor layer 21 disposed on the buffer layer 61, a first gate insulating layer 62 disposed on the first semiconductor layer 21, a first gate layer 31 disposed on the first gate insulating layer 62, a first insulating layer 63 disposed on the first gate layer 31, a first metal layer 41 disposed on the first insulating layer 63, a second insulating layer 64 disposed on the first metal layer 41, a light-shielding layer 51 disposed on the second insulating layer 64, a third insulating layer 65 disposed on the light-shielding layer 51, a second semiconductor layer 22 disposed on the third insulating layer 65, a second gate insulating layer 66 disposed on the second semiconductor layer 22, a second gate layer 32 disposed on the second gate insulating layer 66, a fourth insulating layer 67 disposed on the second gate layer 32, a second metal layer 42 disposed on the fourth insulating layer 67, a first flat layer 68 disposed on the second metal layer 42, a third metal layer 43 disposed on the first flat layer 68, a second flat layer 69 disposed on the third metal layer 43, an anode layer 52 disposed on the second flat layer 69, and a pixel defining layer 70 disposed on the anode layer 52.

In some embodiments, the pixel driving circuit 1101 includes a driving transistor T1, a switching transistor T2, a first reset transistor T3, a second reset transistor T4, and a storage capacitor Cst.

The first semiconductor layer 21 includes the driving active portion 211 of the driving transistor T1, and a first reset active portion 212 of the first reset transistor T3. The first gate layer 31 includes a driving gate 311 of the driving transistor T1, and a first control signal line 312. The first metal layer 41 includes a power signal line 411, a first reset signal line 412, and a capacitor plate 413. The second semiconductor layer 22 includes the switching active portion 221 of the switching transistor T2, and a second reset active portion 222 of the second reset transistor T4. The second gate layer 32 includes a second control signal line 321, and a third control signal line 322. The second metal layer 42 includes a data line 421. The third metal layer 43 includes a second reset signal line 431. The anode layer 52 includes an anode 521.

The driving gate 311 of the driving transistor T1 is connected to a first node A. A source of the driving transistor T1 is connected to the power signal line 411. A drain of the driving transistor T1 is connected to a second node B, and a power signal VDD is input through the power signal line 411.

A gate of the switching transistor T2 is connected to the second control signal line 321 to receive a second control signal Gn. A source of the switching transistor T2 is connected to the data line 421. A drain of the switching transistor T2 is connected to the first node A, and a data signal Vdata is input through the data line 421.

A gate of the first reset transistor T3 is connected to the first control signal line 312 to receive a first control signal INI. A source of the first reset transistor T3 is connected to the first reset signal line 412. A drain of the first reset transistor T3 is connected to the second node B, and a first reset signal Vini is input through the first reset signal line 412.

A gate of the second reset transistor T4 is connected to the third control signal line 322 to receive a third control signal REF. A source of the second reset transistor T4 is connected to the second reset signal line 431. A drain of the second reset transistor T4 is connected to the second node B, and a second reset signal Vref is output through the second reset signal line 431.

The storage capacitor Cst includes the driving gate 311, and the capacitor plate 413. The driving gate 311 is connected to the first node A, and the capacitor plate 413 is connected to the second node B.

Furthermore, a connection structure of each film layer to the pixel driving circuit 1101 is described in detail below with referring to FIGS. 2, 4, 5, 6, 7, and 8.

Figure 9:
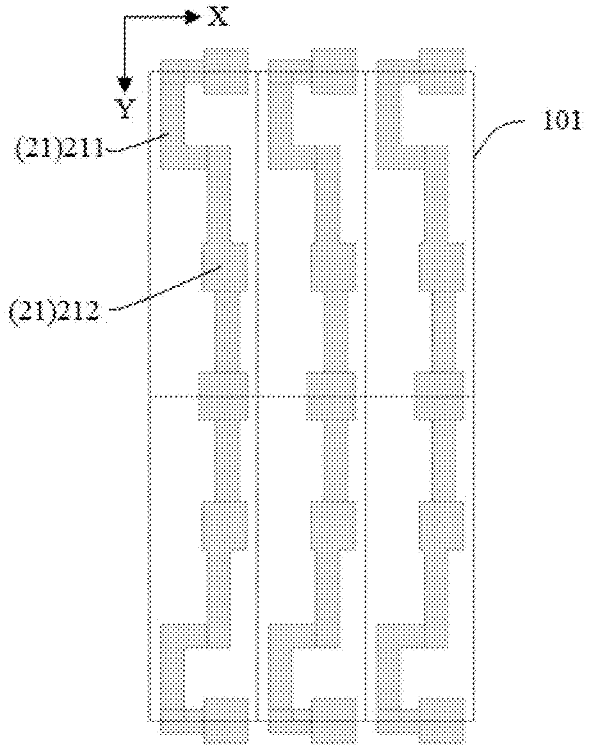
FIG. 9 is a schematic structural diagram of a first semiconductor layer of a driving substrate according to one or more embodiments of the present application.

Referring to FIG. 9, the first semiconductor layer 21 is disposed on a side of the buffer layer 61 away from the substrate 10. The first semiconductor layer 21 includes the driving active portion 211, and the first reset active portion 212. The driving active portion 211 extends in a folded line, which means that some parts of the driving active portion 211 extend along the first direction X, while other parts of the driving active portion 21 extend along the second direction Y. The first reset active portion 212 extends along the second direction Y and is connected to the driving active portion 211.

The first semiconductor layer 21, corresponding to two adjacent pixel driving circuits 1101 along the second direction Y, is arranged in axial symmetry. Of the two adjacent pixel driving circuits 110, the first reset active portion 212 of one pixel driving circuit 110 and the first reset active part 212 of the other pixel driving circuit 110 are connected to each other, and the driving active part 211 in one pixel driving circuit 1101 is disposed on a side of the first reset active part 212 away from the other pixel driving circuit 1101.

Figure 10:
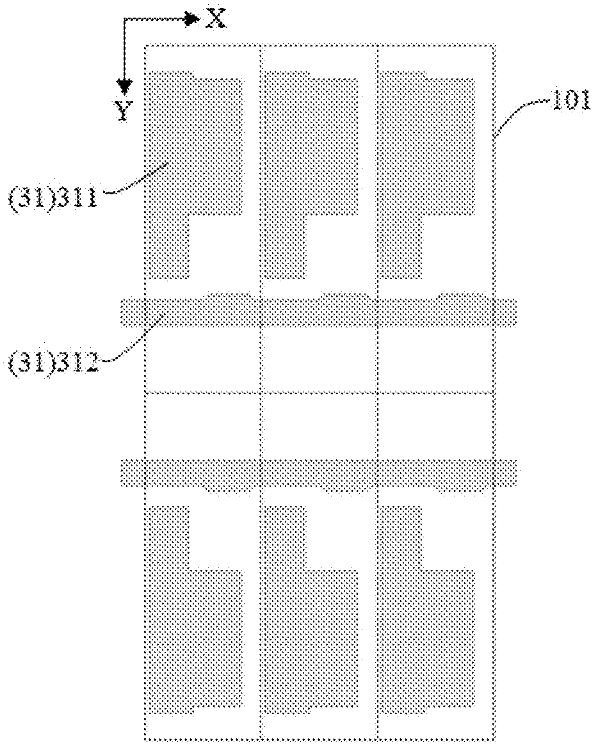
FIG. 10 is a schematic structural diagram of a first gate layer of a driving substrate according to one or more embodiments of the present application.

Referring to FIG. 10, the first gate layer 31 is disposed on a side of the first semiconductor layer 21 away from the buffer layer 61. The first gate layer 31 includes the driving gate 311, and the first control signal line 312.

An orthographic projection of the driving active portion 211 on the substrate 10 partially overlaps with an orthographic projection of the driving gate 311 on the substrate 10, and an overlapping portion of the driving active portion 211 with the driving gate 311 is a channel of the driving active portion 211. The first control signal line 312 extends along the first direction X, and overlaps with the first reset active portion 212 in the thickness direction of the driving substrate. An overlapping portion of the first reset active portion 212 with the first control signal line 312 is a channel of the first reset active portion 212, and an overlapping portion of the first control signal line 312 with the first reset active portion 212 further acts as the gate of the first reset transistor T3.

Figure 11:
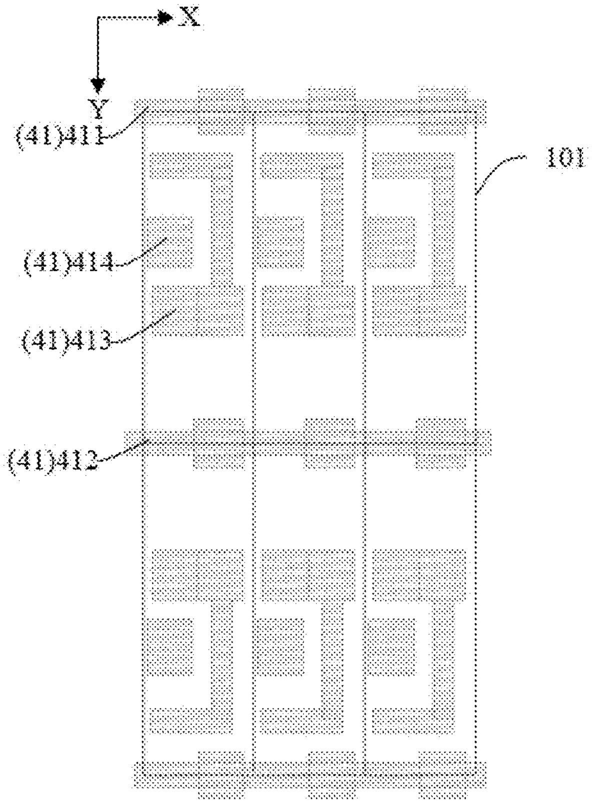
FIG. 11 is a schematic structural diagram of a first metal layer of a driving substrate according to one or more embodiments of the present application.

Referring to FIG. 11, the first metal layer 41 is disposed on a side of the first gate layer 31 away from the first semiconductor layer 21. The first metal layer 41 includes the power signal line 411, the first reset signal line 412, the capacitor plate 413, and the fourth transfer line 414.

The power signal line 411 extends along the first direction X. The driving active portion 211 is connected to the power signal line 411 at a first connection point 11. A portion of the driving active portion 211 connected to the power signal line 411 further acts as the source of the driving transistor T1 to input the power signal VDD. The driving active portion 211 is connected to the capacitor plate 413 at the second node B. A portion of the driving active portion 211 connected to the capacitor plate 413 at the second node B further acts as the drain of the driving transistor T1. The capacitor plate 413 can further act as a transfer line. The first reset signal line 412 extends along the first direction X. The first reset active portion 212 is connected to the first reset signal line 412 at a second connection point 12. A portion of the first reset active portion 212 connected to the first reset signal line 412 further acts as the source of the first reset transistor T3 to input the first reset signal Vini, while a portion of the first reset active portion 212 connected to the driving active portion 211 further acts as the drain of the first reset transistor T3.

In some embodiments, the power signal line 411 is connected to a side of the driving active portion 211 away from the first reset active portion 212, and the first reset signal line 412 is connected to a side of the first reset active portion 212 away from the driving active portion 211.

In some embodiments, the first semiconductor layer 21, corresponding to two adjacent pixel driving circuits 1101 along the second direction Y, is arranged in axial symmetry. Of the two adjacent pixel driving circuits 1101, the first reset active portion 212 of one pixel driving circuit 1101 and the first reset active portion 212 of the other pixel driving circuit 1101 are connected to each other, and both of them are connected to the same first reset signal line 412. This configuration allows the two adjacent pixel driving circuits 1101 along the second direction Y to share the same first reset signal line 412, which in turn increases the wiring space, increase a wire spacing, and reduce a probability of short-circuiting of the trace.

The fourth transfer line 414 is connected to the driving gate 311 at the first node A.

The capacitor plate 413 partially overlaps with the driving gate 311 in the thickness direction of the driving substrate to form the storage capacitor Cst.

Figure 12:
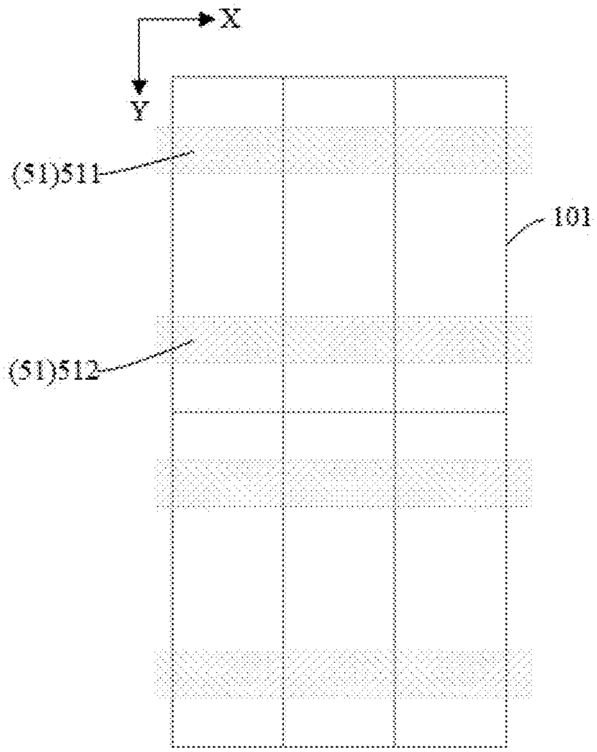
FIG. 12 is a schematic structural diagram of a light-shielding layer of a driving substrate according to one or more embodiments of the present application.

Referring to FIG. 12, the light-shielding layer 51 is disposed on a side of the first metal layer 41 away from the first gate layer 31. The light-shielding layer 51 includes a first light-shielding portion 511, and a second light-shielding portion 512, both extending along the first direction X.

Figure 13:
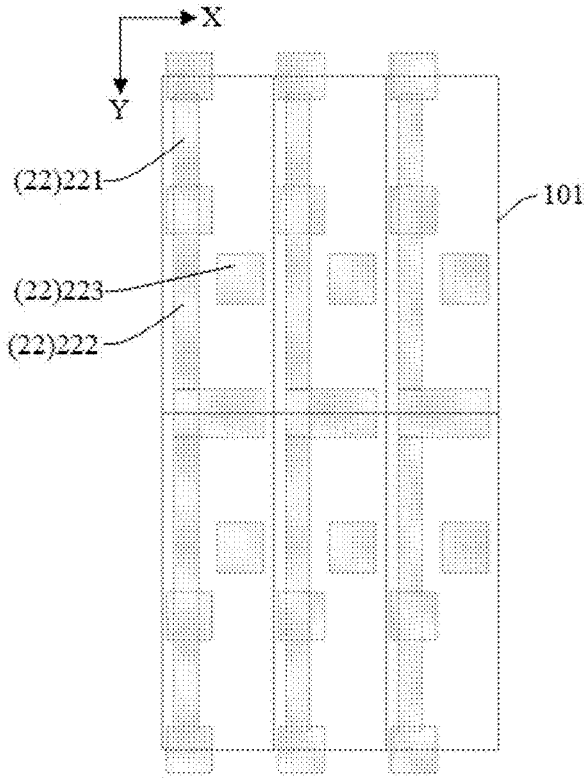
FIG. 13 is a schematic structural diagram of a second semiconductor layer of a driving substrate according to one or more embodiments of the present application.

Referring to FIG. 13, the second semiconductor layer 22 is disposed on a side of the light-shielding layer 51 away from the first metal layer 41. The second semiconductor layer 22 includes the switching active portion 221, the second reset active portion 222, and a first transfer line 223.

The switching active portion 221 extends along the second direction Y. The second reset active portion 222 extends along the second direction Y. The switching active portion 221 is connected to the second reset active portion 222. The second semiconductor layer 22, corresponding to two adjacent pixel driving circuits 1101 along the second direction Y, is arranged in axial symmetry. Of the two adjacent pixel driving circuits 1101, the second reset active portion 222 of one pixel driving circuit 1101 is connected to the second reset active portion 222 of the other pixel driving circuit 1101, and the switching active portion 221 in one pixel driving circuit 1101 is disposed on a side of the second reset active portion 222 away from the other pixel driving circuit 1101.

The switching active portion 221 is connected to the fourth transfer line 414 at the first node A. At the first node A, the switching active portion 221 is further connected to the driving gate 311 through the fourth transfer line 414. A portion of the switching active portion 221 connected to the fourth transfer line 414 at the first node A further acts as the drain of the switching transistor T2. Similarly, a portion of the second reset active portion 222 connected to the switching active portion 221 further acts as the drain of the second reset transistor T4.

In some embodiments, an orthographic projection of a portion of the driving active portion 211 extending along the second direction Y on the substrate 10 partially overlaps with an orthographic projection of the switching active portion 221 on the substrate 10.

An orthographic projection of the first light-shielding portion 511 on the substrate 10 partially overlaps with the orthographic projection of the switching active portion 221 on the substrate 10, and an orthographic projection of the second light-shielding portion 512 on the substrate 10 partially overlaps with an orthographic projection of the second reset active portion 222 on the substrate 10. The first light-shielding portion 511 and the second light-shielding portion 512 function to block light and shield interference, thereby enhancing the electrical characteristics of the switching active portion 221 and the second reset active portion 222.

In some embodiments, a first part of the capacitor plate 413 extends along the first direction X, and a second part of the capacitor plate 413 extends along the second direction Y. An orthographic projection of the first part of the capacitor plate 413 extending along the first direction X on the substrate 10 partially overlaps with the orthographic projection of the switching active portion 221 on the substrate 10. Furthermore, the orthographic projection of the first part of the capacitor plate 413 extending along the first direction X on the substrate 10 partially overlaps with the orthographic projection of the second reset active portion 222 on the substrate 10. As a result, the capacitor plate 413 can function to block light and shield interference, thereby enhancing the electrical characteristics of the switching active portion 221 and the second reset active portion 222.

Figure 14:
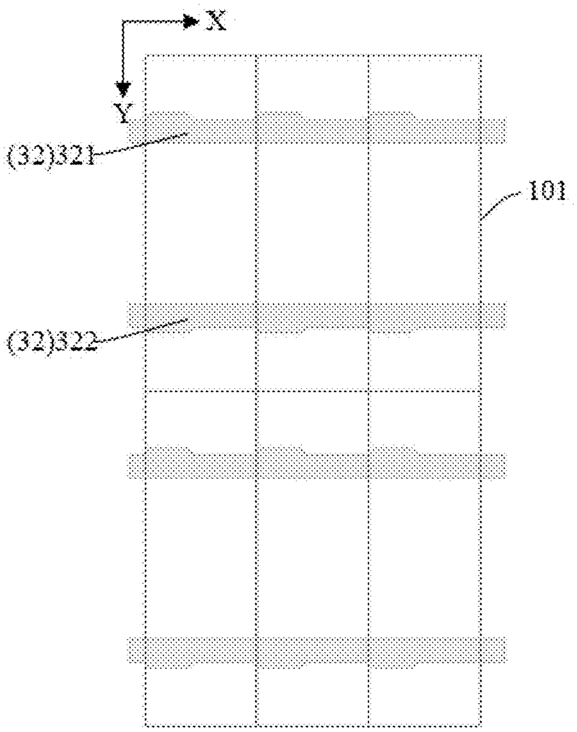
FIG. 14 is a schematic structural diagram of a second gate layer of a driving substrate according to one or more embodiments of the present application.

Referring to FIG. 14, the second gate layer 32 is located on a side of the second semiconductor layer 22 away from the light-shielding layer 51. The second gate layer 32 includes the second control signal line 321, and the third control signal line 322.

The second control signal line 321 extends along the first direction X. The second control signal line 321 overlaps with the switching active portion 221 in the thickness direction of the driving substrate. A portion of the second control signal line 321 overlapping with the switching active portion 221 further acts as the gate of the switching transistor T2.

The third control signal line 322 extends along the first direction X. The third control signal line 322 overlaps with the second reset active portion 222 in the thickness direction of the driving substrate. A portion of the third control signal line 322 overlapping with the second reset active portion 222 further acts as the gate of the second reset transistor T4.

Figure 15:
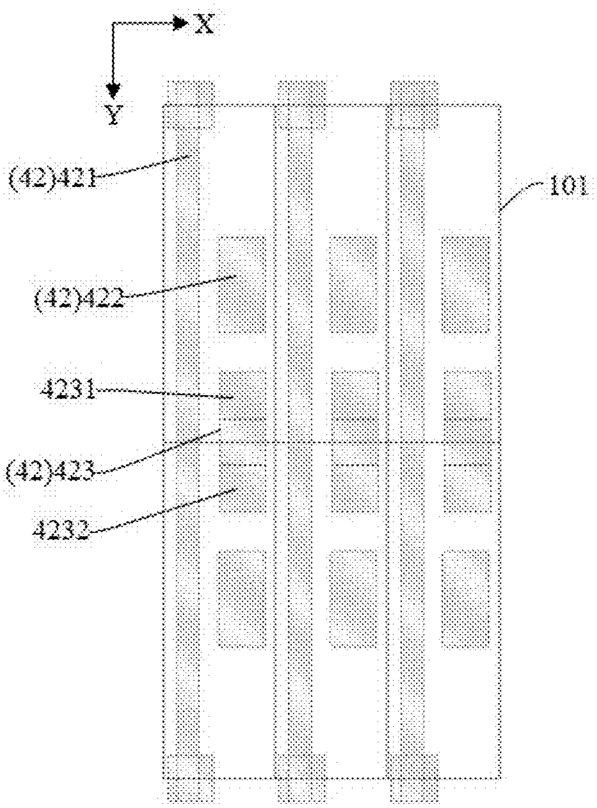
FIG. 15 is a schematic structural diagram of a second metal layer of a driving substrate according to one or more embodiments of the present application.

Referring to FIG. 15, the second metal layer 42 is disposed on a side of the second gate layer 32 away from the second semiconductor layer 22. The second metal layer 42 includes a plurality of the data lines 421, a second transfer line 422, and a signal transmitting portion 423.

The plurality of the data lines 421 are arranged along the first direction X. The data line 421 extends along the second direction Y. The data line 421 is connected to the switching active portion 221 at a third connection point 13 to input a data line signal Vdata. A portion of the switching active portion 221 connected to the data line 421 further acts as the source of the switching transistor T2, alternatively, a portion of the data line 421 connected to the switching active portion 221 further acts as the source of the switching transistor T2.

In some embodiments, an orthographic projection of the data line 421 on the substrate 10 partially overlaps with the orthographic projection of the switching active portion 221 on the substrate 10. Additionally, the orthographic projection of the data line 421 on the substrate 10 partially overlaps with the orthographic projection of the second reset active portion 222 on the substrate 10.

The second transfer line 422 is connected to the first transfer line 223 at the second node B. At the second node B, the second transfer line 422 is further connected to the driving active portion 211 and the first reset active portion 212 through the first transfer line 223 and the capacitor plate 413.

The signal transmitting portion 423 is connected between the second reset signal line 431 and the second reset active portion 222. Along the second direction Y, the signal transmitting portion 423 includes a first end 4231, and a second end 4232, which are disposed opposite to each other. Due to an axial symmetric arrangement of the second semiconductor layers 22 corresponding to two adjacent pixel driving circuits 1101, the second reset active portion 222 of one of the two adjacent pixel driving circuits 1101 is connected to the second reset active portion 222 of the other one of the two adjacent pixel driving circuits 1101. A portion of the signal transmitting portion 423 that is located between the first end 4231 and the second end 4232 connects to the two second reset active portions 222 that are connected to each other at a fourth connection point 14 to transmit signals to both the second reset active portions 222. Additionally, a portion of the second reset active portion 222 connected to the signal transmitting portion 423 further acts as the source of the second reset transistor T4.

Figure 16:
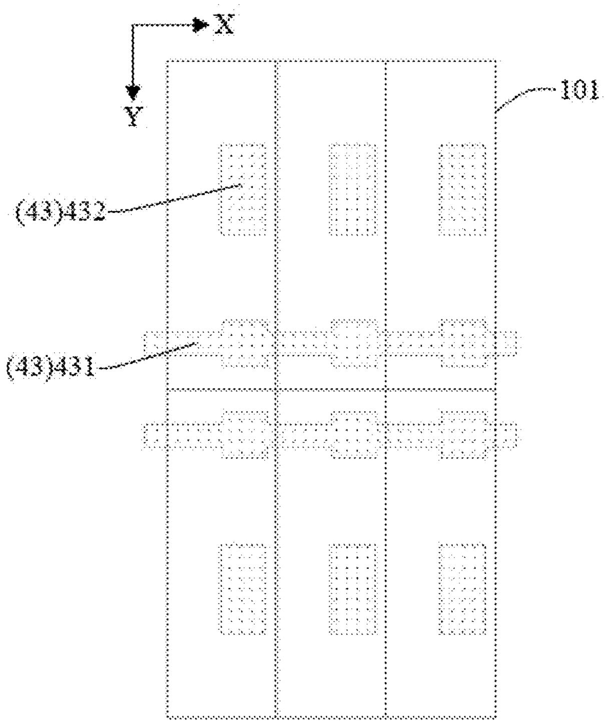
FIG. 16 is a schematic structural diagram of a third metal layer of a driving substrate according to one or more embodiments of the present application.

Referring to FIG. 16, the third metal layer 43 is disposed on a side of the second metal layer 42 away from the second gate layer 32. The third metal layer 43 includes the second reset signal line 431, and a third transfer line 432.

The second reset signal line 431 extends along the first direction X. At a fifth connection point 15, the second reset signal line 431 is connected to the first end 4231 and second end 4232 of the signal transmitting portion 423; and the second reset signal line 431 transmits the second reset signal Vref to the second reset active portion 222 through the signal transmitting portion 423.

In some embodiments, two second reset signal lines 431 are disposed at a junction of the two adjacent pixel driving circuits 1101 along the second direction Y. The first end 4231 and second end 4232 of the signal transmitting portion 423, which are disposed opposite to each other in the second direction Y, are connected to the two second reset signal lines 431 respectively. This configuration allows signals to be transmitted to two second reset active portions 222 through two second reset signal lines 431, thereby enhancing a transmitting stability of the second reset signal Vref, and reducing a probability of the second reset signal Vref being interfered. Consequently, the performance and display effect of the driving substrate is improved.

The third transfer line 432 is connected to the second transfer line 422 at the second node B. And the third transfer line 432 is connected to the driving active portion 211 and the first reset active portion 212 through the second transfer line 422, the first transfer line 223, and the capacitor plate 413.

Figure 17:
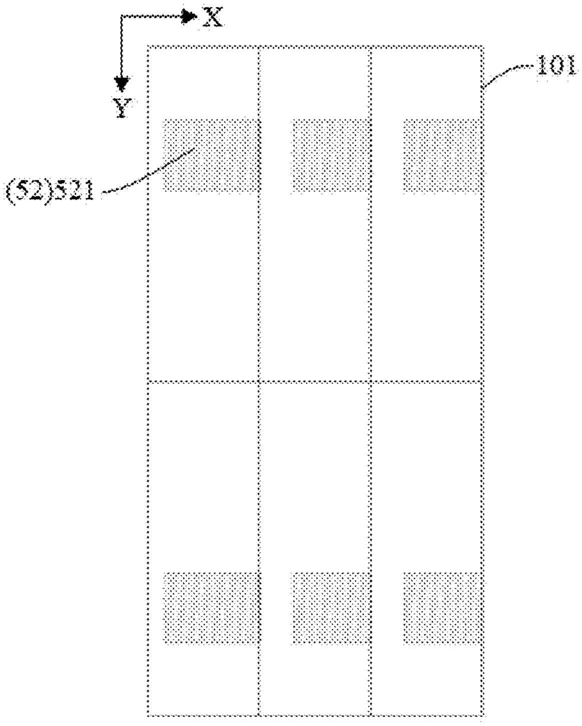
FIG. 17 is a schematic structural diagram of an anode layer of a driving substrate according to one or more embodiments of the present application.

Referring to FIG. 17, the anode layer 52 is disposed on a side of the third metal layer 43 away from the second metal layer 42. The anode layer 52 includes a plurality of anodes 521 corresponding to the plurality of pixel regions 101. The plurality of anodes 521 are disposed within the plurality of pixel regions 101 in a one-to-one correspondence.

The anode 521 is connected to the third transfer line 432 at the second node B. At the second node B, the anode 521 is further connected to the driving active portion 211 through the third transfer line 432, the second transfer line 422, the first transfer line 223, and the capacitor plate 413. This configuration allows signals to be transmitted between the driving transistor T1 and the anode 521.

It can be understood that, in the embodiments of this application, a relatively large distance between the driving transistor T1 and the anode 521 leads to a significant depth of a contact hole. Consequently, in the embodiments of this application, a same layer material of the second semiconductor layer 22 can be used to form the first transfer line 223 to realize signal transmission. This configuration can improve a connection between the anode 521 and the driving active portion 211 and enhance the stability of signal transmission without the need for additional transfer lines, thereby saving process steps and reducing costs. For instance, when forming the second semiconductor layer 22, a channel portion of the switching active portion 221 and a channel portion of the second reset active portion 222 formed in the second semiconductor layer 22 can be maintained as semiconductors, while remaining portions of the second semiconductor layer 22 are made conductive. This treatment ensures that the first transfer line 223 is made of conductive material and used for signal transmission.

In some embodiments, the plurality of pixel regions 101 may include a red pixel region, a green pixel region, and a blue pixel region. In the embodiments of the present application, based on variations in luminous efficiency among different colored pixel regions 101, areas of the anodes 521 located within different pixel regions 101 are adjusted to be different from each other. For instance, the area of the anode 521 located in the red pixel region is larger than the area of the anode 521 located in the green pixel region, while the area of the anode 521 located in the green pixel region is equal to the area of the anode 521 located in the blue pixel region.

It should be clarified that, in the embodiments of this application, the material of the driving active portion 211 differs from the material of the switching active portion 221, which indicates that a material of the second semiconductor layer 22 is different from a material of the first semiconductor layer 21.

In some embodiments, the material of the driving active portion 211 includes a polycrystalline silicon, while the material of the switching active portion 221 includes a metal oxide, such as Indium Gallium Zinc Oxide (IGZO).

In some embodiments, two adjacent pixel driving circuits (1101) along the second direction Y are arranged in axial symmetry.

In some embodiments, patterns of two adjacent pixel driving circuits 1101 along the first direction X are identical.

It should be clarified that, in the schematic structural diagram of the pixel driving circuit 1101 provided in the embodiments of this application, structures within six adjacent pixel regions 101 are illustrated, and structures of the pixel driving circuit 1101 within remaining pixel regions 101 on the driving substrate can be configured by referring to the aforementioned embodiments.

In summary, the embodiments of the present application can increase a space in a film layer to arrange the greater number of components and traces by arranging the driving active portion 211 of the driving transistor T1 and the switching active portion 221 of the switching transistor T2 in different layers. Additionally, the driving active portion 211 and the switching active portion 221 partially overlap along the thickness direction of the driving substrate, which can further increase a wiring space to increase the number of thin-film transistors, and improve the performance and resolution of the driving substrate.

The embodiments of the present application further provide a display device. The display device includes the driving substrate described in the aforementioned embodiments.

It can be understood that, since the display device includes the driving substrate identical to the aforementioned embodiments, the display device has the same beneficial effects as the driving substrate. Therefore, details are not described herein again.

In the description of this application, the terms "first", "second", etc. are only used for descriptive purposes, and cannot be understood as indicating or implying relative importance or implicitly indicating the number of technical features indicated. Thus, the characteristics that are defined as "first" or "second", etc. may explicitly or implicitly include one or more of the characteristics. In the description of the present application, "a plurality of" means two or more, unless otherwise specifically limited.

In the aforementioned embodiments, the descriptions of each embodiment have their own emphases, and for parts not described in detail in a certain embodiment, please refer to the relevant descriptions in other embodiments.

The embodiments, implementations, and related technical characteristics described in this application can be combined or interchanged with each other as long as there is no conflict.

The embodiments mentioned above are merely part of the embodiments of the present application and should not be construed as limiting the present application in any form. Any simple modifications, equivalent variations, or embellishments made to the above embodiments based on the technical essence of this application, without departing from the content of the technical solutions of this application, shall fall within the scope of this application.

What is claimed is:

1. A driving substrate, wherein the driving substrate comprises a plurality of pixel regions, and a plurality of pixel driving circuits corresponding to the plurality of pixel regions; each of the plurality of pixel driving circuits comprises a switching transistor and a driving transistor connected to each other;

the switching transistor comprises a switching active portion; the driving transistor comprises a driving active portion; a material of the switching active portion differs from a material of the driving active portion; the switching active portion and the driving active portion are arranged in different layers, and the switching active portion partially overlaps with the driving active portion in a thickness direction of the driving substrate;

wherein the plurality of pixel regions are arranged along a first direction and a second direction, and the first direction and the second direction intersect with each other;

the driving substrate comprises:

a substrate, a first semiconductor layer disposed on the substrate and comprising the driving active portion, and a second semiconductor layer disposed on a side of the first semiconductor layer away from the substrate and comprising the switching active portion; a material of the second semiconductor layer is different from a material of the first semiconductor layer;

the switching active portion extends along the second direction; a portion of the driving active portion extends along the second direction; and the driving active portion extending along the second direction partially overlaps with the switching active portion in the thickness direction of the driving substrate;

wherein each of the plurality of pixel driving circuits further comprises a first reset transistor connected to the driving transistor, and a second reset transistor connected to the switching transistor;

the first semiconductor layer further comprises a first reset active portion of the first reset transistor, which extends along the second direction and connects with the driving active portion; and the second semiconductor layer further comprises a second reset active portion of the second reset transistor, which extends along the second direction and connects with the switching active portion.

2. The driving substrate of claim 1, wherein the driving substrate further comprises:

a first gate layer disposed between the first semiconductor layer and the second semiconductor layer; the first gate layer comprises a driving gate of the driving transistor, and a first control signal line extending along the first direction;

the driving gate partially overlaps with the driving active portion in the thickness direction of the driving substrate; the switching active portion is connected to the driving gate, and the first control signal line overlaps with the first reset active portion in the thickness direction of the driving substrate.

3. The driving substrate of claim 2, wherein the driving substrate further comprises:

a first metal layer disposed between the first gate layer and the second semiconductor layer; the first metal layer comprises a power signal line and a first reset signal line, which extend along the first direction;

the power signal line is connected to a side of the driving active portion away from the first reset active portion; and the first reset signal line is connected to a side of the first reset active portion away from the driving active portion.

4. The driving substrate of claim 3, wherein the first semiconductor layer corresponding to two adjacent ones of the plurality of pixel driving circuits along the second direction is arranged in axial symmetry; of the two adjacent ones of the plurality of pixel driving circuits, the first reset active portion of a first pixel driving circuit and the first reset active portion of a second pixel driving circuit are connected to each other, and connected to the same first reset signal line.

5. The driving substrate of claim 3, wherein the first metal layer further comprises a capacitor plate, which partially overlaps with the driving gate in the thickness direction of the driving substrate and is connected to the driving active portion.

6. The driving substrate of claim 5, wherein the second semiconductor layer further comprises a first transfer line, which is connected to the capacitor plate;

the driving substrate further comprises:

a second metal layer disposed on a side of the second semiconductor layer away from the first metal layer; the second metal layer comprises a second transfer line, and a plurality of data lines arranged along the first direction;

each of the plurality of data lines extends along the second direction and connects with the switching active portion; and the second transfer line connects with the first transfer line.

7. The driving substrate of claim 6, wherein the driving substrate further comprises:

a third metal layer disposed on a side of the second metal layer away from the second semiconductor layer; the third metal layer comprises a third transfer line and a second reset signal line extending along the first direction;

the second metal layer further comprises a signal transmitting portion, which is connected between the second reset signal line and the second reset active portion;

and the third transfer line is connected to the second transfer line.

8. The driving substrate of claim 7, wherein the driving substrate further comprises:

an anode layer disposed on a side of the third metal layer away from the second metal layer; the anode layer comprises a plurality of anodes corresponding to the plurality of pixel regions; each of the plurality of anodes is connected to the third transfer line.

9. The driving substrate of claim 7, wherein the second semiconductor layer corresponding to two adjacent ones of the plurality of pixel driving circuits along the second direction is arranged in axial symmetry; of the two adjacent ones of the plurality of pixel driving circuits, the second reset active portion of a first pixel driving circuit is connected to the second reset active portion of a second pixel driving circuit;

two second reset signal lines are disposed at a junction of the two adjacent ones of the pixel driving circuits along the second direction; a first end and a second end of the signal transmitting portion, which are disposed opposite to each other in the second direction, are connected to the two second reset signal lines respectively; a portion of the signal transmitting portion located between the first end and the second end is connected to the two second reset active portions.

10. The driving substrate of claim 5, wherein an orthographic projection of the capacitor plate on the substrate partially overlaps with an orthographic projection of the switching active portion on the substrate; and the orthographic projection of the capacitor plate on the substrate partially overlaps with an orthographic projection of the second reset active portion on the substrate.

11. The driving substrate of claim 1, wherein the driving substrate further comprises:

a second gate layer disposed on a side of the second semiconductor layer away from the first semiconductor layer; the second gate layer comprises a second control signal line extending along the first direction, and a third control signal line extending along the first direction;

the second control signal line overlaps with the switching active portion in the thickness direction of the driving substrate; and the third control signal line overlaps with the second reset active portion in the thickness direction of the driving substrate.

12. The driving substrate of claim 1, wherein two adjacent ones of the plurality of pixel driving circuits along the second direction are arranged in axial symmetry.

13. The driving substrate of claim 1, wherein patterns of two adjacent ones of the plurality of pixel driving circuits along the first direction are identical.

14. The driving substrate of claim 1, wherein a material of the driving active portion comprises a polycrystalline silicon material, and a material of the switching active portion comprises a metal oxide material.

15. A display device, wherein the display device comprises a driving substrate, the driving substrate comprises a plurality of pixel regions, and a plurality of pixel driving circuits corresponding to the plurality of pixel regions; each of the plurality of pixel driving circuits comprises a switching transistor and a driving transistor connected to each other;

the switching transistor comprises a switching active portion; the driving transistor comprises a driving active portion; a material of the switching active portion differs from a material of the driving active portion; the switching active portion and the driving active portion are arranged in different layers, and the switching active portion partially overlaps with the driving active portion in a thickness direction of the driving substrate;

wherein the plurality of pixel regions are arranged along a first direction and a second direction, and the first direction and the second direction intersect with each other;

the driving substrate comprises:

a substrate, a first semiconductor layer disposed on the substrate and comprising the driving active portion, and a second semiconductor layer disposed on a side of the first semiconductor layer away from the substrate and comprising the switching active portion; a material of the second semiconductor layer is different from a material of the first semiconductor layer:

the switching active portion extends along the second direction; a portion of the driving active portion extends along the second direction; and the driving active portion extending along the second direction partially overlaps with the switching active portion in the thickness direction of the driving substrate;

wherein each of the plurality of pixel driving circuits further comprises a first reset transistor connected to the driving transistor, and a second reset transistor connected to the switching transistor;

the first semiconductor layer further comprises a first reset active portion of the first reset transistor, which extends along the second direction and connects with the driving active portion; and the second semiconductor layer further comprises a second reset active portion of the second reset transistor, which extends along the second direction and connects with the switching active portion.

16. The display device of claim 15, wherein the driving substrate further comprises:

a first gate layer disposed between the first semiconductor layer and the second semiconductor layer; the first gate layer comprises a driving gate of the driving transistor, and a first control signal line extending along the first direction;

the driving gate partially overlaps with the driving active portion in the thickness direction of the driving substrate; the switching active portion is connected to the driving gate, and the first control signal line overlaps with the first reset active portion in the thickness direction of the driving substrate.

17. The display device of claim 16, wherein the driving substrate further comprises:

a first metal layer disposed between the first gate layer and the second semiconductor layer; the first metal layer comprises a power signal line and a first reset signal line, which extend along the first direction;

the power signal line is connected to a side of the driving active portion away from the first reset active portion; and the first reset signal line is connected to a side of the first reset active portion away from the driving active portion.

18. The display device of claim 17, wherein the first semiconductor layer corresponding to two adjacent ones of the plurality of pixel driving circuits along the second direction is arranged in axial symmetry; of the two adjacent ones of the plurality of pixel driving circuits, the first reset active portion of a first pixel driving circuit and the first reset active portion of a second pixel driving circuit are connected to each other, and connected to the same first reset signal line.

19. The display device of claim 17, wherein the first metal layer further comprises a capacitor plate, which partially overlaps with the driving gate in the thickness direction of the driving substrate and is connected to the driving active portion.

20. The display device of claim 19, wherein the second semiconductor layer further comprises a first transfer line, which is connected to the capacitor plate;

the driving substrate further comprises:

a second metal layer disposed on a side of the second semiconductor layer away from the first metal layer; the second metal layer comprises a second transfer line, and a plurality of data lines arranged along the first direction;

each of the plurality of data lines extends along the second direction and connects with the switching active portion; and the second transfer line connects with the first transfer line.

* * * * *